United States Patent
Bogen

(10) Patent No.: US 9,462,708 B2
(45) Date of Patent: Oct. 4, 2016

(54) POWER SEMICONDUCTOR DEVICE

(71) Applicant: Semikron Elektronik GmbH & Co., KG, Nürnberg (DE)

(72) Inventor: Ingo Bogen, Nürnberg (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 0 days.

(21) Appl. No.: 14/670,237

(22) Filed: Mar. 26, 2015

(65) Prior Publication Data

US 2015/0282339 A1 Oct. 1, 2015

(30) Foreign Application Priority Data

Mar. 26, 2014 (DE) .................. 10 2014 104 194

(51) Int. Cl.
| | |
|---|---|
| *H05K 7/00* | (2006.01) |
| *H05K 5/00* | (2006.01) |
| *H05K 1/02* | (2006.01) |
| *H05K 1/18* | (2006.01) |
| *H05K 7/14* | (2006.01) |

(52) U.S. Cl.
CPC .......... *H05K 5/0056* (2013.01); *H05K 1/0203* (2013.01); *H05K 1/181* (2013.01); *H05K 5/0008* (2013.01); *H05K 7/1432* (2013.01)

(58) Field of Classification Search
None
See application file for complete search history.

(56) References Cited

U.S. PATENT DOCUMENTS

| 7,242,584 B2 * | 7/2007 | Kroneder | H01L 24/49 257/678 |
|---|---|---|---|
| 2007/0119574 A1 * | 5/2007 | Olesen | F28F 3/12 165/100 |
| 2013/0062751 A1 * | 3/2013 | Takagi | H01L 23/3675 257/692 |
| 2013/0277820 A1 * | 10/2013 | Hotta | H01L 23/4006 257/712 |

FOREIGN PATENT DOCUMENTS

DE 39 15 707 11/1990

* cited by examiner

*Primary Examiner* — Robert Bachner
(74) *Attorney, Agent, or Firm* — The Law Offices of Roger S. Thompson

(57) ABSTRACT

A power semiconductor device comprising: a body, a substrate and power semiconductor components arranged on and connected to the substrate. The device has electrically conductive load connection elements and an integrally formed housing which runs laterally around the components. The body has a main outer surface which runs laterally around the components and which is at least partially covered by an elastic, electrically nonconductive, integrally formed, structured sealing element which runs laterally around the components. A section of the sealing element is arranged between the housing and the main outer surface of the body. The housing and the main outer surface of the body are pressed against the sealing element, which seals off the housing from the main outer surface of the body. The invention provides a compact device whose load connection elements are reliably electrically insulated from the body and whose housing is reliably sealed off from the body.

10 Claims, 4 Drawing Sheets

POWER SEMICONDUCTOR DEVICE

BACKGROUND OF THE INVENTION

1. Field of the Invention

The invention relates to power semiconductor devices.

2. Description of the Related Art

Generally, known power semiconductor devices, such as, for example, power semiconductor switches and diodes, are arranged on a substrate and electrically conductively connected to one another by a conductor layer of the substrate, and bonding wires and/or a film composite. The power semiconductor switches in this case generally are in the form of transistors, such as, for example, IGBTs (insulated-gate bipolar transistors) or MOSFETs (metal-oxide semiconductor field-effect transistors) or in the form of thyristors. The substrate is generally connected directly or indirectly to a metallic basic body, which is generally in the form of a heat sink or a baseplate, which is intended for connection to a heat sink.

Such power semiconductor components are often electrically interconnected to form one or more so-called half-bridge circuits, which are used, for example, for rectifying and inverting electric voltages and currents.

Such known power semiconductor devices have load connection elements for guiding load currents, with the aid of which load connection elements the power semiconductor devices are electrically conductively connected to external components. These load currents generally have, in contrast to control currents which are used for actuating the power semiconductor switches, for example, a high current intensity. The load connection elements generally need to be passed through the housing of the power semiconductor device. In this case, power semiconductor devices often need to be protected from spraywater, for example, so that firstly the load connection elements need to be sealed off from the housing of the power semiconductor device and secondly the housing of the power semiconductor device must be sealed off from the metallic basic body of the power semiconductor device.

Since the load connection elements generally have a different electrical potential than the basic body of the power semiconductor device, sufficiently long electrical leakage parts and air gaps between the load connection elements and the basic body of the power semiconductor device need to be provided in order to ensure sufficient electrical insulation. This requirement runs counter to the general technical requirement of making power semiconductor devices compact.

SUMMARY OF THE INVENTION

It is therefore an object of the invention to provide an improved compact power semiconductor device whose load connection elements are electrically insulated reliably from the basic body of the power semiconductor device and whose housing is sealed off reliably from the basic body.

This object is achieved by a power semiconductor device comprising: a substrate and power semiconductor components arranged on and connected to the substrate, wherein the substrate is connected directly or indirectly to a metallic basic body, wherein the power semiconductor device has electrically conductive load connection elements for making electrical contact with the power semiconductor device, wherein the power semiconductor device has an integrally formed first housing part, which runs laterally around the power semiconductor components, wherein the basic body has a first main outer surface, which runs laterally around the power semiconductor components and is covered areally, at least partially, by an elastic, electrically nonconductive, integrally formed, structured first sealing element, which runs laterally around the power semiconductor components, wherein a section of the first sealing element is arranged between the first housing part and the first main outer surface of the basic body, wherein the first housing part and the first main outer surface of the basic body are arranged pressed against the first sealing element, and the first sealing element seals off the first housing part from the first main outer surface of the basic body.

It has proven to be advantageous if at least the majority of the first main outer surface is covered areally by the first sealing element since this provides particularly reliable electrical insulation of the load connection elements from the basic body of the power semiconductor device.

Furthermore, it has also proven to be advantageous if the electrically conductive load connection elements pass through the first housing part in the lateral direction towards the outside, wherein the load connection elements each have an outer connection section arranged outside the first housing part, wherein the basic body has a lateral secondary outer surface, wherein the first sealing element covers the lateral secondary outer surface of the basic body at least in the region of the respective outer connection section. As a result, reliable electrical insulation of the load connection elements from the basic body of the power semiconductor device is also achieved outside the first housing part.

In addition, it has proven to be advantageous if the basic body is in the form of an air-type or liquid-type heat sink or in the form of a baseplate, which is intended for connection to an air-type or liquid-type heat sink. The mentioned designs of the basic body are conventional designs.

Furthermore, it has proven to be advantageous if the first sealing element is neither cohesively connected to the basic body nor cohesively connected to the first housing part. The first sealing element can therefore be replaced easily in the event of a fault.

Additionally, it has proven to be advantageous if the first sealing element consists of an elastomer since in this case the first sealing element has a particularly long life.

Furthermore, it has proven to be advantageous if the first sealing element has a thickened portion which runs laterally around the power semiconductor components, wherein the thickened portion of the sealing element is arranged between the first housing part and the first main outer surface of the basic body, wherein the thickened portion of the first sealing element seals off the first housing part from the first main outer surface of the basic body. As a result, particularly reliable sealing-off of the first housing part from the basic body is achieved.

Furthermore, it has proven to be advantageous if the first housing part is connected to the basic body by one or more screw connections, wherein the first housing part and the first main outer surface of the basic body are pressed against the first sealing element by the screw connections pressing the first housing part and the basic body together. By the screw connections, firstly the first housing part is connected to the basic body and secondly the first housing part and the basic body are pushed towards one another by the screw connections.

Furthermore, it has proven successful to use a power semiconductor device system comprising first and a second power semiconductor devices, according to the invention, wherein the basic body of the second power semiconductor device has a second main outer surface, which is arranged opposite the first main outer surface of the basic body of the second power semiconductor device, wherein a second sealing element is arranged between the second main outer surface of the basic body of the second power semiconductor device and the first housing part of the first power semiconductor device and seals off the second main outer surface of the basic body of the second power semiconductor device from the first housing part of the first power semiconductor device. As a result, a particularly compact power semiconductor device system is provided.

In addition, it has proven to be advantageous if the second sealing element is in the form of a sealing ring. A design of the second sealing element as a sealing ring is a particularly simple design for sealing.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
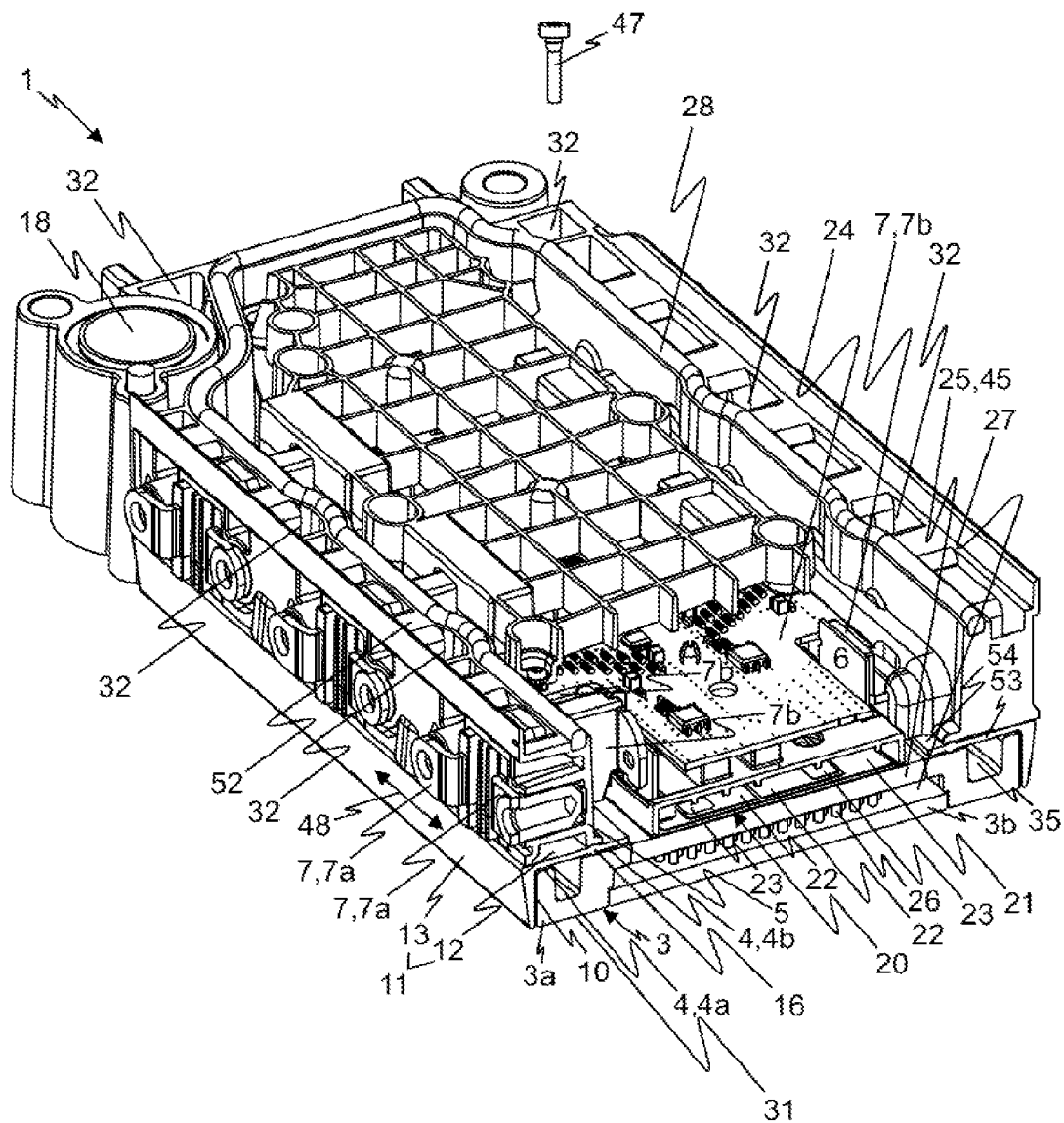
FIG. 1 shows a perspective sectional illustration of a power semiconductor device according to the invention.

FIG. 1 shows a perspective sectional illustration of a power semiconductor device 1 according to the invention. Power semiconductor device 1 has a substrate 20, on which power semiconductor components 23 are arranged and connected to substrate 20. Each respective power semiconductor component 23 is preferably in the form of a power semiconductor switch or diode. The power semiconductor switches are in this case generally in the form of transistors, such as, for example, IGBTs (insulated-gate bipolar transistors) or MOSFETs (metal-oxide semiconductor field-effect transistors) or in the form of thyristors. Substrate 20 has an insulating body 21 (for example made of a ceramic) and an electrically conductive structured first conducting layer, which is arranged on a first side of insulating body 21 and is connected to insulating body 21 and which forms conductor tracks 22 owing to its structure, within the scope of the exemplary embodiment. Preferably, substrate 20 has an electrically conductive, preferably unstructured second conducting layer, wherein insulating body 21 is arranged between the structured first conducting layer and the second conducting layer. Substrate 20, as in the exemplary embodiment, can be in the form of a direct copper bonded substrate (DCB substrate) or in the form of an insulated metal substrate (IMS), for example. The conductor tracks of the substrate can also be formed, for example, by electrically conductive leadframes, which are arranged on an insulating body, such as, for example, an electrically nonconductive film. The leadframes and the electrically nonconductive film to such an extent form a substrate. Power semiconductor components 23 are preferably connected to conductor tracks 22 cohesively (for example by a soldered or sintered layer). In FIG. 1, for reasons of clarity, the soldered layer which cohesively connects power semiconductor components 23 to conductor tracks 22 is not illustrated. As an alternative or in addition, power semiconductor components 23 can be connected to conductor tracks 22, for example, by a pressure connection, by, for example, a pressure being exerted on power semiconductor components 23 in the direction of conductor tracks 22.

It will be mentioned that power semiconductor components 23 are electrically conductively connected to one another on their side remote from substrate 20 by, for example, bonding wires and/or a film composite and to conductor tracks 22 of substrate 20, corresponding to the desired electrical circuit, which is intended to implement power semiconductor device 1. For reasons of clarity, these electrical connections are not shown in FIG. 1.

Substrate 20 is connected directly or indirectly to a metallic basic body 3. Within the scope of the exemplary embodiment, metallic basic body 3 has a frame element 3a running around power semiconductor components 23 and a bottom element 3b, which is connected cohesively (for example by a welded connection) to frame element 3a. Metallic basic body 3, within the scope of the exemplary embodiment, is in the form of a liquid-type heat sink. Metallic basic body 3 could also be in the form of an air-type heat sink, for example, which preferably has cooling fins and/or cooling pins, or in the form of a baseplate, which is intended for connection to an air-type or liquid-type heat sink. Metallic basic body 3 within the scope of the exemplary embodiment forms a channel 27, through which a cooling liquid (for example water) flows. The cooling liquid enters or leaves the channel 27 via openings 18 (see FIG. 2). Within the scope of the exemplary embodiment, substrate 20 is arranged on a cooling plate 25 provided with cooling pins 26, which protrude into channel 27, and is connected to cooling plate 25. Cooling plate 25 forms a cover for an opening 45 of metallic basic body 3 and is connected to metallic basic body 3. Substrate 20 is connected to metallic basic body 3 via cooling plate 25 and therefore indirectly. Alternatively, substrate 20 could also be connected directly to metallic basic body 3 by, for example, substrate 20 being arranged on metallic basic body 3 and being connected to metallic basic body 3.

The direct or indirect connection of substrate 20 to metallic basic body 3 can be cohesive, for example (for example by a single or a plurality of soldered or sintered layers). As an alternative or in addition, the direct or indirect connection of substrate 20 to metallic basic body 3 can take place, for example, by a pressure connection by, for example, a pressure being exerted on substrate in the direction of metallic basic body 3. However, other connection types are of course also possible, and would be known and appreciated by one of ordinary skill in the art.

Furthermore, power semiconductor device 1 has an integrally formed first housing part 5 which runs laterally around power semiconductor components 23. It will be mentioned here that first housing part 5 does not necessarily run laterally around power semiconductor components 23 on the same plane on which power semiconductor components 23 are arranged, but can also run laterally around power semiconductor components 23 slightly above power semiconductor components 23. First housing part 5 is preferably made of plastic.

In order to make electrical contact between power semiconductor device 1 and the external electrical line devices, such as, for example, electrically conductive rails or cables, power semiconductor device 1 has electrically conductive load connection elements 7. Load connection elements 7 are used for conducting load currents. The load currents which flow through load connection elements 7 in this case generally have a high current intensity in comparison with control currents which are used, for example, for actuating power semiconductor components when power semiconductor components are in the form of power semiconductor switches. Load connection elements 7 each have an outer connection section 7a arranged outside first housing part 5 and an inner connection section 7b arranged within first housing part 5 of power semiconductor device 1. Furthermore, power semiconductor device 1 has electrically conductive connecting elements 6, which connect substrate 20, more precisely the first conducting layer of substrate 20, to the electrically conductive load connection elements 7. Load connection elements 7 can also be formed integrally with the respectively associated connecting elements 6.

Figure 2:
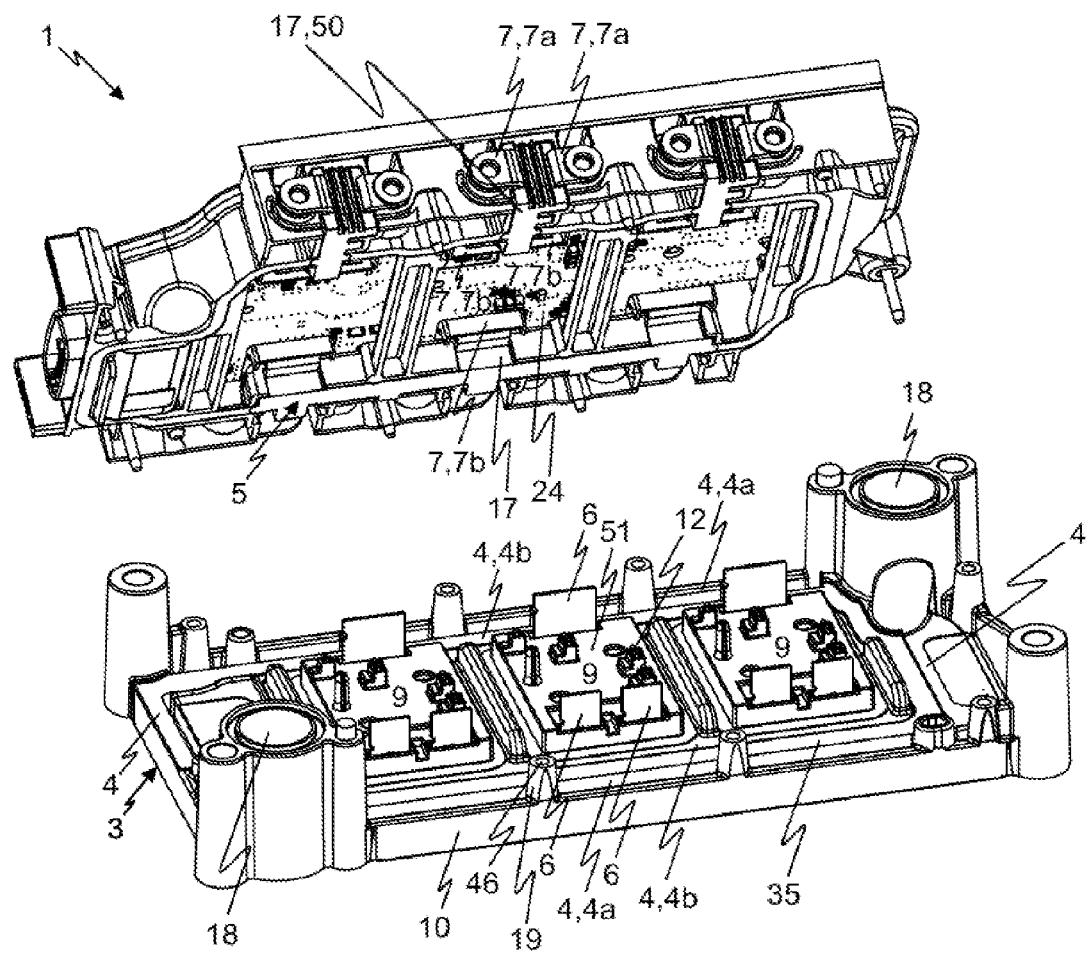
FIG. 2 shows a perspective illustration of an as yet incompletely produced power semiconductor device according to the invention without the first sealing element.
Figure 3:
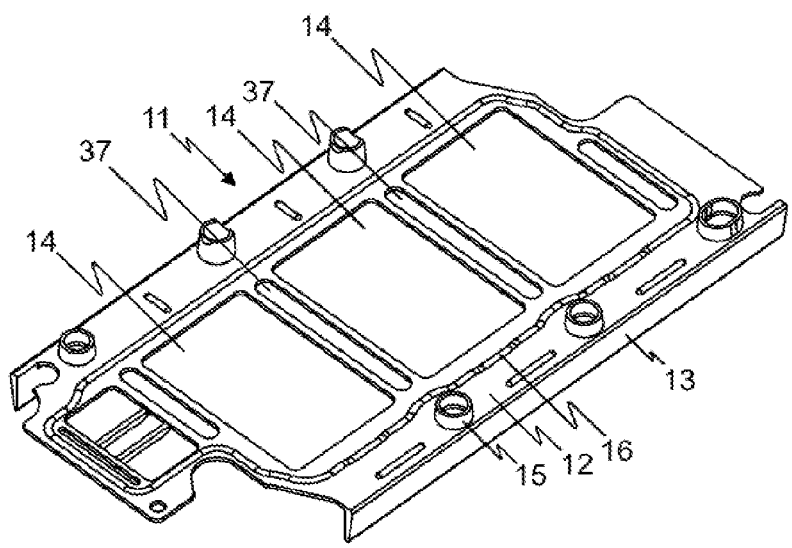
FIG. 3 shows a first sealing element.
Figure 4:
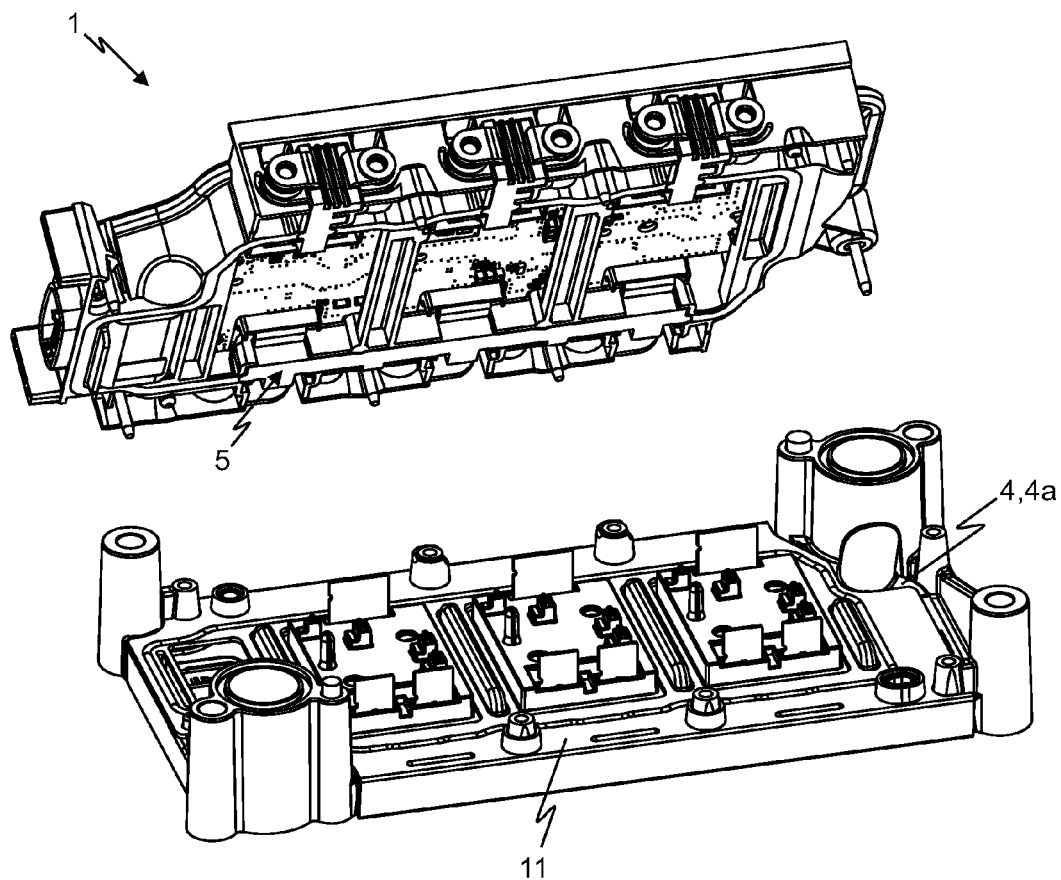
FIG. 4 shows a perspective illustration of an as yet not completely produced power semiconductor device according to the invention having a first sealing element positioned on a basic body of the power semiconductor device.

Metallic basic body 3 has a first main outer surface 4, which runs laterally around power semiconductor components 23 and which is covered areally, at least partially, by an elastic, electrically nonconductive, integrally formed, structured first sealing element 11 which runs laterally around power semiconductor components 23 (see also FIGS. 2-4). It will be mentioned here that first sealing element 11 does not necessarily run laterally around power semiconductor components 23 on the same plane on which power semiconductor components 23 are arranged, but can also run laterally around power semiconductor components 23 slightly below or above power semiconductor components 23. A section 53 of first sealing element 11 is arranged between first housing part 5 and first main outer surface 4 of metallic basic body 3. A further section 54 of first sealing element 11 is not arranged between first housing part 5 and first main outer surface 4 of metallic basic body 3, but is arranged in the interior of first housing part 5. First main outer surface 4 preferably extends on one plane, and can have a plurality of main outer surface sections 4a and 4b, which are separated from one another by at least one groove 35 in metallic basic body 3, for example. First sealing element 11 preferably covers the at least one groove 35 of metallic basic body 3.

First sealing element 11 preferably consists of an elastomer, such as, for example, silicone or an ethylene-propylene-diene-rubber. The silicone is preferably in the form of a crosslinked liquid silicone rubber or in the form of a crosslinked solid silicone rubber.

First sealing element 11 is preferably neither cohesively connected to metallic basic body 3 nor cohesively connected to first housing part 5 and to such an extent is preferably in the form of an individual part which is removable from metallic basic body 3. Alternatively, first sealing element 11 can be cohesively connected to metallic basic body 3. First sealing element 11 is structured and preferably has, owing to its structure, one or more cutouts 14 or 37. The inner walls of cutouts 14 run around power semiconductor components 23. Furthermore, first sealing element 11 preferably has structure elements 15 protruding from a main surface 12 of first sealing element 11 (see FIG. 3).

First sealing element 11 preferably covers the majority (i.e., more than about 50%) of first main outer surface 4 of metallic basic body 3 and can also completely cover in particular first main outer surface 4 of metallic basic body 3.

First housing part 5 and first main outer surface 4 of metallic basic body 3 are arranged pressed against first sealing element 11, with the result that first sealing element 11 seals off first housing part 5 from first main outer surface 4 of metallic basic body 3.

First sealing element 11 therefore has a dual function in accordance with the invention. Firstly, first sealing element 11 reliably seals off first housing part 5 from metallic basic body 3 so that the housing of power semiconductor device 1 is sealed off reliably from metallic basic body 3 of power semiconductor device 1, and secondly first sealing element 11 within first housing part 5 extends electrical leakage parts and air gaps between load connection elements 7 and metallic basic body 3 of power semiconductor device 1, with the result that power semiconductor device 1 can have a compact design since the physical size of power semiconductor device 1 can be reduced and nevertheless the electrical leakage paths and air gaps required for reliable electrical insulation can be realized.

Preferably, first housing part 5 is connected to metallic basic body 3 by screw connections, wherein first housing part 5 and first main outer surface 4 of metallic basic body 3 are arranged pressed against first sealing element 11 within the scope of the exemplary embodiment by the screw connections pressing first housing part 5 and metallic basic body 3 towards one another. In order to realize the screw connections, within the scope of the exemplary embodiment, metallic basic body 3 preferably has holes 46 arranged in elevations 19 and provided with an internal thread (see FIG. 2), and first housing part 5 has depressions 32 with a respective hole provided in the bottom of said depressions, through which depressions the shafts of screws 47 are passed and screwed into the internal thread of holes 46. It will be mentioned that, for reasons of clarity, only one screw 47 is illustrated in FIG. 1. Structure elements 15 of first sealing element 11 preferably surround elevations 19. Elevations 19 are preferably in the form of truncated cones.

Preferably, first sealing element 11 has a thickened portion 16, which runs laterally around power semiconductor components 23, wherein thickened portion 16 of first sealing element 11 is arranged between first housing part 5 and first main outer surface 4 of metallic basic body 3, wherein thickened portion 16 of first sealing element 11 seals off first housing part 5 particularly reliably from first main outer surface 4 of metallic basic body 3. Thickened portion 16 preferably forms a first bulge formed in the direction of first housing part 5 and/or a second bulge formed in the direction of metallic basic body 3.

Within the scope of the exemplary embodiment, electrically conductive load connection elements 7 extend outwards through first housing part 5 in the lateral direction, wherein load connection elements 7 each have an outer connection section 7a, which is arranged outside first housing part 5, wherein metallic basic body 3 has a lateral secondary outer surface 10 (see FIG. 2), wherein first sealing element 11 covers lateral secondary outer surface 10 of metallic basic body 3 at least in the region 48 of the respective outer connection section 7a. The respective outer connection section 7a is preferably arranged on a lateral outer side of first housing part 5. For reasons of clarity, only one region 48 is illustrated in FIG. 1. Load connection elements 7 preferably extend through cutouts 17 in first housing part 5, wherein seals 50 are arranged between load connection elements 7 and first housing part 5 for sealing purposes, said seals closing cutouts 17. Preferably, first sealing element 11 covers the majority (i.e., at least about 50%) and in particular all of lateral secondary outer surface 10 of metallic basic body 3. Lateral secondary outer surface 10 preferably extends perpendicular to first main outer surface 4 of metallic basic body 3. By this measure, first sealing element 11 also extends electrical leakage paths and air gaps between load connection elements 7 and metallic basic body 3 of power semiconductor device 1 outside first housing part 5, with the result that power semiconductor device 1 can be particularly compact since the physical size of power semiconductor device 1 can be reduced and nevertheless the electrical leakage path and air gaps required for reliable electrical insulation can still be realized.

FIG. 2 shows a perspective illustration of an as yet incompletely produced power semiconductor device 1 according to the invention without a first sealing element 11, which is illustrated in FIG. 3. Within the scope of the exemplary embodiment, power semiconductor device 1 has power semiconductor modules 9, which each have, in the interior of their power semiconductor module housing 51, substrate 20 illustrated by way of example in FIG. 1 and power semiconductor components 23. The respective power semiconductor module 9 has control connection elements 12, which are used for actuating those power semiconductor components 23 which are in the form of power semiconductor switches in the exemplary embodiment. Furthermore, power semiconductor device 1 has driver circuits, preferably for actuating the power semiconductor switches, said driver circuits being arranged on a printed circuit board 24. It will be mentioned that, within the scope of the exemplary embodiment, a DC voltage is inverted into a three-phase AC voltage or a three-phase AC voltage is rectified into a DC voltage by power semiconductor device 1 and the three power semiconductor modules 9, respectively.

In a first mounting step, first sealing element 11 illustrated by way of example in FIG. 3 is positioned on first main outer surface 4 of metallic basic body 3 so that the arrangement illustrated in FIG. 4 is produced. In the exemplary embodiment, first sealing element 11 covers the majority (i.e., more than about 50%) of first main outer surface 4 of metallic basic body 3. In the exemplary embodiment, relatively small main outer surface sections 4a of first main outer surface 4 in whose direct vicinity preferably no load connection elements 7 are arranged remain uncovered by first sealing element 11.

Figure 5:
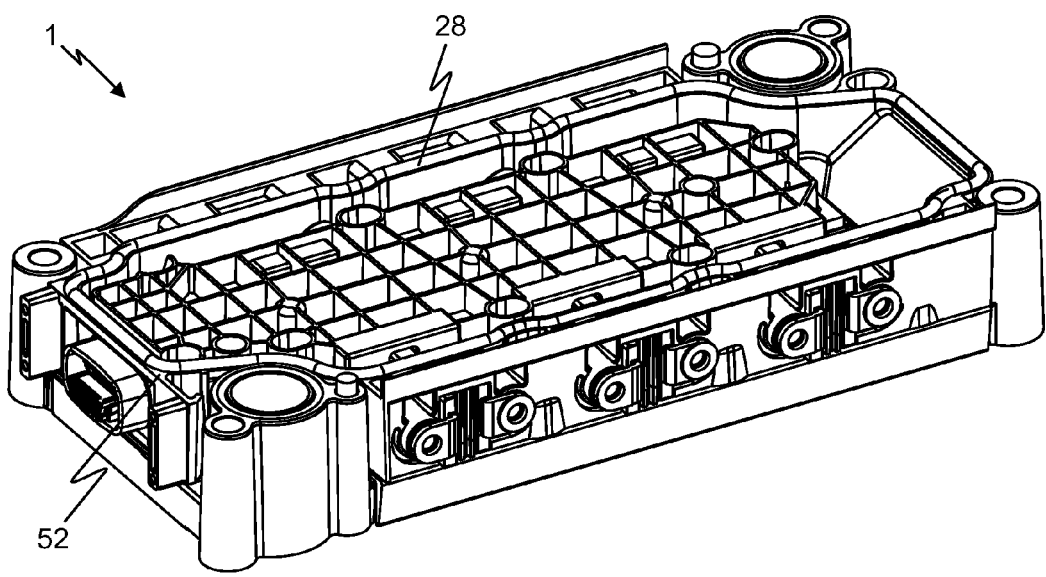
FIG. 5 shows a perspective illustration of a power semiconductor device according to the invention.

Then, first housing part 5 is arranged on first sealing element 11 and is connected to metallic basic body 3 by screw connections, wherein, to such an extent, first housing part 5 and first main outer surface 4 of metallic basic body 3 are arranged pressed against first sealing element 11 once they have been screwed together. FIG. 5 shows a perspective illustration of the completely mounted power semiconductor device 1 according to the invention.

As illustrated by way of example in FIG. 1 and FIG. 5, a second sealing element 28, preferably in the form of a sealing ring, is preferably arranged on that side 52 of first housing part 5 which is remote from first main outer surface 4 of metallic basic body 3. Second sealing element 28 provides sealing with respect to a second housing part, which is preferably in the form of, or acts as, a cover for first housing part 5. Second sealing element 28 or the sealing ring can be in the form of, for example, an individual part which is removable from the remote side 52 of first housing part 5 or an element which is cohesively connected to the remote side 52 of first housing part 5. Second sealing element 28 or the sealing ring can be foamed, for example, onto the remote side 52 of first housing part 5. The cover closes power semiconductor device 1 at the top. It will be mentioned here that the second housing part can also be formed integrally with first housing part 5, with the result that the housing of power semiconductor device 1 according to the invention can also only consist of first housing part 5. Furthermore, it will be mentioned that the housing of power semiconductor device 1 can also have more than two housing parts.

It is particularly advantageous if, as described below, a plurality of power semiconductor devices according to the invention are arranged next to one another in a row to form a power semiconductor device system and the basic body of one power semiconductor device forms the cover for the first housing part of the directly adjacent power semiconductor device.

Figure 6:
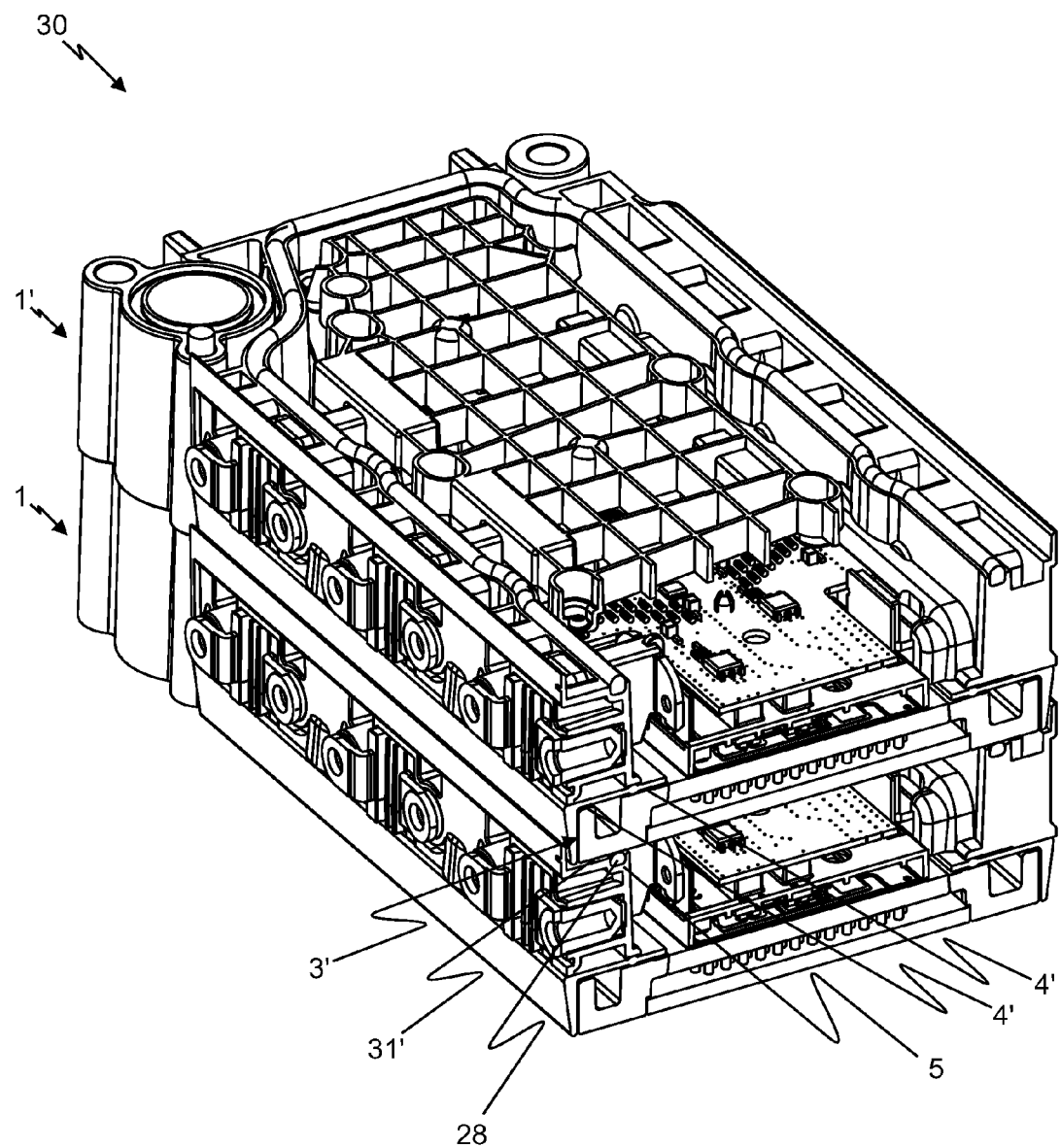
FIG. 6 shows a perspective illustration of a power semiconductor device system according to the invention.

FIG. 6 shows, by way of example, a power semiconductor device system 30 comprising a first power semiconductor device 1 according to the invention and a second power semiconductor device 1' also according to the invention. Metallic basic body 3' of the second power semiconductor device 1' has a second main outer surface 31', which is arranged opposite first main outer surface 4' of metallic basic body 3' of second power semiconductor device 1', wherein a second sealing element 28 is arranged between second main outer surface 31' of metallic basic body 3' of second power semiconductor device 1' and first housing part 5 of first power semiconductor device 1, which second sealing element 28 seals off second main outer surface 31' of metallic basic body 3' of second power semiconductor device 1' from first housing part 5 of first power semiconductor device 1.

Power semiconductor device system 30 can of course also have further power semiconductor devices according to the invention which are arranged next to one another in a similar way to first and second power semiconductor devices 1 and 1'.

It will be mentioned at this juncture that features of various exemplary embodiments of the invention, so long as the features are not mutually exclusive, can of course be combined with one another as desired.

In the preceding Detailed Description, reference was made to the accompanying drawings, which form a part of his disclosure, and in which are shown illustrative specific embodiments of the invention. In this regard, directional terminology, such as "top", "bottom", "left", "right", "front", "back", etc., is used with reference to the orientation of the Figure(s) with which such terms are used. Because components of embodiments can be positioned in a number of different orientations, the directional terminology is used for purposes of ease of understanding and illustration only and is not to be considered limiting.

Additionally, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power semiconductor device, comprising:
a metallic basic body;
a substrate connected to said metallic basic body;
power semiconductor components arranged on and connected to said substrate;
electrically conductive load connection elements for making electrical contact with power semiconductor device; and
an integrally formed first housing part, which runs laterally around said power semiconductor components;
wherein said metallic basic body has a first main outer surface, which runs laterally around said power semiconductor components and is covered areally, at least partially, by an elastic, electrically nonconductive, integrally formed, structured first sealing element, which runs laterally around power semiconductor components;
wherein a section of said first sealing element is arranged between said first housing part and said first main outer surface of said metallic basic body; and
wherein said first housing part and said first main outer surface of said metallic basic body are arranged pressed against said first sealing element, and said first sealing element seals off said first housing part from said first main outer surface of said metallic basic body.

2. The power semiconductor device of claim 1, wherein at least about 50% of said first main outer surface is covered areally by said first sealing element.

3. The power semiconductor device of claim 1
wherein said electrically conductive load connection elements pass through said first housing part in the lateral direction towards the outside of said first housing part;
wherein said load connection elements each have an outer connection section arranged outside said first housing part;
wherein said metallic basic body has a lateral secondary outer surface; and
wherein said first sealing element covers said lateral secondary outer surface of said metallic basic body at least in the region of said respective outer connection section.

4. The power semiconductor device of claim 1, wherein said metallic basic body is in the form of one of the group consisting of: an air-type heat sink, a liquid-type heat sink and a baseplate, which is configured for connection to one of an air-type or liquid-type heat sink.

5. The power semiconductor device of claim 1, wherein said first sealing element is neither cohesively connected to said metallic basic body nor cohesively connected to said first housing part.

6. The power semiconductor device of claim 1, wherein said first sealing element is an elastomer.

7. The power semiconductor device of claim 1
wherein said first sealing element has a thickened portion which runs laterally around said power semiconductor components;
wherein said thickened portion of said sealing element is arranged between said first housing part and said first main outer surface of said metallic basic body; and
wherein said thickened portion of said first sealing element seals off said first housing part from said first main outer surface of said metallic basic body.

8. The power semiconductor device of claim 1
wherein said first housing part is connected to said metallic basic body by at least one screw connection; and
wherein said first housing part and said first main outer surface of said metallic basic body are arranged pressed against said first sealing element by said at least one screw connection pressing said first housing part and said metallic basic body towards one another.

9. A power semiconductor system, comprising:
a first power semiconductor device having
a first metallic basic body;
a first substrate connected to said first metallic basic body;
a plurality of first power semiconductor components arranged on and connected to said first substrate;
a plurality of first electrically conductive load connection elements for making electrical contact with said first power semiconductor device; and
a first integrally formed first housing part, which runs laterally around said first power semiconductor components;
wherein said first metallic basic body has a first main outer surface, which runs laterally around said first power semiconductor components and is covered areally, at least partially, by a first elastic, electrically nonconductive, integrally formed, structured first sealing element, which runs laterally around said power semiconductor components;
wherein a first section of said first sealing element is arranged between said first housing part and said first main outer surface of said first metallic basic body; and
wherein said first housing part and said first main outer surface of said first metallic basic body are arranged pressed against said first sealing element, and said first sealing element seals off said first housing part from said first main outer surface of said first metallic basic body; and
a second power semiconductor device having
a second metallic basic body;
a second substrate connected to said second metallic basic body;
a plurality of second power semiconductor components arranged on and connected to said second substrate;
a plurality of second electrically conductive load connection elements for making electrical contact with said second power semiconductor device; and
a second integrally formed second housing part, which runs laterally around said second power semiconductor components;
wherein said second metallic basic body includes
a first main outer surface, which runs laterally around said second power semiconductor components and is covered areally, at least partially, by an elastic, electrically nonconductive, integrally formed, structured first sealing element, which runs laterally around said power semiconductor components;
a second main outer surface, which is arranged opposite said first main outer surface of said second metallic basic body of said second power semiconductor device;

a second sealing element arranged between said second main outer surface of said second metallic basic body of said second power semiconductor device and said first housing part of said first power semiconductor device, said second sealing element also sealing off said second main outer surface of said second metallic basic body of said second power semiconductor device from said first housing part of said first power semiconductor device;

wherein a second section of said second sealing element is arranged between said second housing part and said second main outer surface of said second metallic basic body; and wherein said second housing part and said second main outer surface of said second metallic basic body are arranged pressed against said second sealing element, and said second sealing element seals off said second housing part from said second main outer surface of said second metallic basic body.

10. The power semiconductor system of claim 9, wherein said second sealing element is in the form of a sealing ring.

* * * * *